United States Patent
Feng et al.

(10) Patent No.: US 12,158,650 B2
(45) Date of Patent: Dec. 3, 2024

(54) PROTECTIVE FILM, METHOD FOR FABRICATING SAME, AND DISPLAY DEVICE

(71) Applicant: Shenzhen China Star Optoelectronics Semiconductor Display Technology Co., Ltd., Shenzhen (CN)

(72) Inventors: Zhengyu Feng, Shenzhen (CN); Galatu Suri, Shenzhen (CN); Zhiqing Shi, Shenzhen (CN); Limei Zeng, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 128 days.

(21) Appl. No.: 17/053,762

(22) PCT Filed: Aug. 4, 2020

(86) PCT No.: PCT/CN2020/106831
§ 371 (c)(1),
(2) Date: Nov. 7, 2020

(87) PCT Pub. No.: WO2022/007078
PCT Pub. Date: Jan. 13, 2022

(65) Prior Publication Data
US 2023/0341720 A1    Oct. 26, 2023

(30) Foreign Application Priority Data
Jul. 6, 2020 (CN) .......................... 202010641168.6

(51) Int. Cl.
*G02F 1/1334* (2006.01)
*G02F 1/1337* (2006.01)
(Continued)

(52) U.S. Cl.
CPC ........ *G02F 1/1334* (2013.01); *G02F 1/13378* (2013.01); *G02F 1/1339* (2013.01);
(Continued)

(58) Field of Classification Search
CPC .. G02F 1/1334; G02F 1/1339; G02F 1/13476; G02F 1/13378; G02F 1/133769;
(Continued)

(56) References Cited

U.S. PATENT DOCUMENTS

2016/0363713 A1   12/2016  Dubrow et al.
2017/0261778 A1*   9/2017  Lan .................. G02F 1/134309
(Continued)

FOREIGN PATENT DOCUMENTS

| CN | 103487857 A | 1/2014 |
| CN | 105204216 A | 12/2015 |

(Continued)

OTHER PUBLICATIONS

English language translation of Korean Patent Application Publication No. KR 10-1212404, published Dec. 13, 2012. Translation downloaded from IP.com on Sep. 19, 2023. Translation provided by the website. (Year: 2012).*

*Primary Examiner* — Angela K Davison
(74) *Attorney, Agent, or Firm* — Nathan & Associates; Menachem Nathan

(57) ABSTRACT

A protective film, a method for fabricating the same, and a display device are provided. The protective film is configured to be applied to a self-luminous display panel. The protective film includes a quantum dot color conversion layer, a first base substrate, a polymer dispersed liquid crystal layer, and a second base substrate. Scattering of liquid crystal monomers in the polymer dispersed liquid crystal layer does not affect brightness of light in a front view direction, and can improve intensity of an emitted
(Continued)

light, thereby effectively improving luminous efficiency of a display panel and user experiences.

6 Claims, 6 Drawing Sheets

(51) Int. Cl.
  *G02F 1/1339* (2006.01)
  *H01L 33/50* (2010.01)
  *H10K 59/50* (2023.01)
(52) U.S. Cl.
  CPC .......... *H01L 33/502* (2013.01); *H10K 59/50* (2023.02); *G02F 2201/50* (2013.01)
(58) Field of Classification Search
  CPC ......... G02F 1/133514; G02F 1/133621; G02F 1/13345; G02F 2201/50; H01L 33/502
  See application file for complete search history.

(56) References Cited

U.S. PATENT DOCUMENTS

| | | |
|---|---|---|
| 2017/0261779 A1 | 9/2017 | Ma et al. |
| 2017/0261780 A1 | 9/2017 | Ma |
| 2020/0133053 A1 | 4/2020 | Yang et al. |

FOREIGN PATENT DOCUMENTS

| | | |
|---|---|---|
| CN | 105242437 A | 1/2016 |
| CN | 105242441 A | 1/2016 |
| CN | 105867019 A | 8/2016 |
| CN | 106526975 A | 3/2017 |
| CN | 110865482 A | 3/2020 |
| CN | 111025758 A | 4/2020 |
| CN | 210323685 U | 4/2020 |

* cited by examiner

PROTECTIVE FILM, METHOD FOR FABRICATING SAME, AND DISPLAY DEVICE

FIELD OF INVENTION

The present disclosure relates to the technical field of display, and particularly to a protective film, a method for fabricating the same, and a display device.

BACKGROUND

Quantum dots (QDs) are a semiconductor material that can realize light conversion and are expected to play an important role in future display technology.

Quantum dots and organic light emitting diode (OLED) devices are combined to form QD-OLED devices, which have advantages of self-luminescence, lightness, thinness, flexibility, and high color gamut, and are considered to be the next generation of display technology.

A QD-OLED device generally has a double-layer structure. One layer of the QD-OLED device comprises blue OLEDs as backlight sources, and the other layer of the QD-OLED device is a quantum dot color filter (QDCF) comprising a QD material for light conversion.

Because a refractive index of the quantum dot color filter is greater than a refractive index of air, when an angle of light generated by excited quantum dots is greater than a critical angle, the light is confined in the quantum dot color filter and cannot be emitted due to total reflection. This leads to a decrease in light efficiency, resulting in a poor overall visual effect of a screen and a body and poor user experiences.

SUMMARY OF DISCLOSURE

A purpose of the present invention is to provide a protective film, a method for fabricating the same, and a display device to solve the problems of low light extraction efficiency of quantum dot color filters due to total reflection, poor overall visual effects of screens and bodies, and poor user experiences.

In order to achieve the above purpose, the present disclosure provides a protective film comprising a quantum dot color conversion layer, a first base substrate, a polymer dispersed liquid crystal layer, and a second base substrate. The first base substrate disposed on the quantum dot color conversion layer. The polymer dispersed liquid crystal layer is disposed on the first base substrate and comprising liquid crystal monomers and a prepolymer. A refractive index of the liquid crystal monomers and a refractive index of the prepolymer are different. The second base substrate is disposed on the polymer dispersed liquid crystal layer.

In an embodiment, each of the liquid crystal monomers has an ordinary refractive index and an extraordinary refractive index. The ordinary refractive index makes a polarization direction of an incident light perpendicular to an optical axis of the liquid crystal monomer. The extraordinary refractive index makes another polarization direction of the incident light parallel to the optical axis of the liquid crystal monomer.

In an embodiment, when the ordinary refractive index of the liquid crystal monomers is same as the refractive index of the prepolymer, in a front view direction, the refractive index of the liquid crystal monomers is same as the refractive index of the prepolymer.

In an embodiment, when the ordinary refractive index of the liquid crystal monomers is same as the refractive index of the prepolymer, and the extraordinary refractive index of the liquid crystal monomers is different from the refractive index of the prepolymer, in a direction of a large viewing angle, the refractive index of the liquid crystal monomers is different from the refractive index of the prepolymer.

In an embodiment, a weight percentage of the prepolymer is 20% to 70%, and a weight percentage of the liquid crystal monomers is 30% to 80%.

In order to achieve the above purpose, the present disclosure further provides a method for fabricating a protective film. The method comprises: providing a quantum dot color conversion layer, forming a first base substrate on the quantum dot color conversion layer; attaching a sealant layer on the first base substrate; forming a second base substrate; disposing the second base substrate on the first base substrate to form a box, wherein a boundary of the second base substrate is attached to a boundary of the first base substrate through the sealant layer; injecting a mixture of a prepolymer and liquid crystal monomers into the box to form a polymer dispersed liquid crystal layer, wherein the prepolymer fills gaps between the liquid crystal monomers, and a refractive index of the liquid crystal monomers and a refractive index of the prepolymer are different; and applying an electric field between the first base substrate and the second base substrate under ultraviolet light.

In an embodiment, in the step of applying the electric field between the first base substrate and the second base substrate under the ultraviolet light, the liquid crystal monomers are aligned along a direction of the electric field and perpendicular to the first base substrate and the second base substrate, the prepolymer is polymerized, an ordinary refractive index of the liquid crystal monomers is same as the refractive index of the prepolymer, and an extraordinary refractive index of the liquid crystal monomers is different from the refractive index of the prepolymer.

In an embodiment, when the ordinary refractive index of the liquid crystal monomers is same as the refractive index of the prepolymer, in a front view direction, the refractive index of the liquid crystal monomers is same as the refractive index of the prepolymer.

In an embodiment, when the ordinary refractive index of the liquid crystal monomers is same as the refractive index of the prepolymer, and the extraordinary refractive index of the liquid crystal monomers is different from the refractive index of the prepolymer, in a direction of a large viewing angle, the refractive index of the liquid crystal monomers is different from the refractive index of the prepolymer.

In order to achieve the above purpose, the present disclosure further provides a display device comprising a display panel and the aforementioned protective film disposed on the display panel.

The present disclosure provides a protective film, a method for fabricating the same, and a display device. The protective film is designed by a principle of light scattering. The protective film comprises a polymer dispersed liquid crystal layer. Scattering of liquid crystal monomers in the polymer dispersed liquid crystal layer does not affect brightness of light in a front view direction, and can improve intensity of an emitted light, thereby effectively improving luminous efficiency of a display panel and user experiences.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Figure 1:
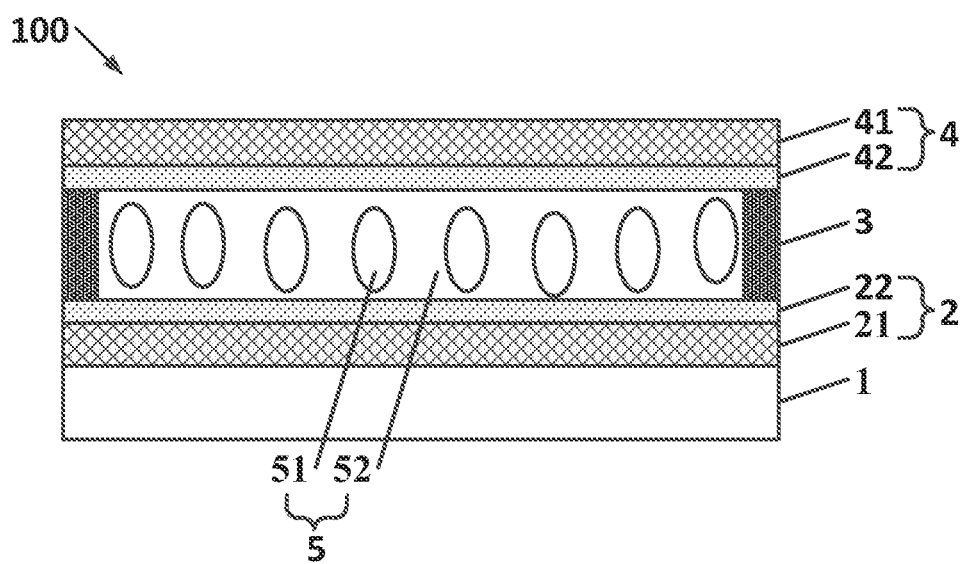
FIG. 1 is a schematic structural diagram of a protective film according to an embodiment of the present disclosure.

Technical solutions in embodiments of the present disclosure will be clearly and completely described below in conjunction with accompanying drawings in the embodiments of the present disclosure. Apparently, the described embodiments are merely some of the embodiments of the present disclosure and not all embodiments. All other embodiments obtained by those skilled in the art based on the embodiments of the present disclosure without creative labor are within the claimed scope of the present invention.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Please refer to FIG. 1, the present disclosure provides a protective film 100 configured to be applied to a self-luminous display panel. The protective film 100 comprises a quantum dot color conversion layer 1, a first base substrate 2, a sealant layer 3, a second base substrate 4, and a polymer dispersed liquid crystal layer 5.

The first base substrate 2 is disposed on the quantum dot color conversion layer 1. The second base substrate 4 is disposed opposite to the first base substrate 2. The polymer dispersed liquid crystal layer 5 is disposed between the second base substrate 4 and the first base substrate 2. The sealant layer 3 is disposed on an upper surface of the first base substrate 2 and close to a boundary of the first base substrate 2.

Specifically, the first base substrate 2 comprises a first substrate 21 and a first transparent electrode 22. The first substrate 21 and the first transparent electrode 22 are sequentially disposed on the quantum dot color conversion layer 1. The second base substrate 4 comprises a second substrate 41 and a second transparent electrode 42. The second substrate 41 is disposed on an upper surface of the second transparent electrode 42. In this embodiment, the first transparent electrode 22 and the second transparent electrode 42 are indium tin oxide (ITO) electrodes. The polymer dispersed liquid crystal layer 5 comprises liquid crystal monomers 51 and a prepolymer 52. The prepolymer 52 fills gaps between the liquid crystal monomers 51.

In this embodiment, the liquid crystal monomers 51 in the protective film 100 are always in a vertical state, and the prepolymer 52 is always in a polymerized state. Therefore, when the protective film 100 is disposed on an upper surface of a display panel, light extraction efficiency of the display panel can be effectively ensured. The prepolymer 52 is preferably made of acrylic monomers. A weight percentage of the prepolymer is 20% to 70%, and a weight percentage of the liquid crystal monomers 51 is 30% to 80%. When an incident light passes through the protective film 100, it can have good light extraction efficiency. In other words, the incident light, i.e. an excitation light, passes through the quantum dot color conversion layer 1, the first base substrate 2, the polymer dispersed liquid crystal layer 5, and the second base substrate 4 in sequence. When the excitation light passes through the polymer dispersed liquid crystal layer 5, it is scattered in different directions. Therefore, when the protective film 100 is applied to a display panel, it can effectively improve overall brightness of output light, thereby improving user experiences.

In this embodiment, an ordinary refractive index of the liquid crystal monomers 51 is same as a refractive index of the prepolymer 52, and an extraordinary refractive index of the liquid crystal monomers 51 is different from the refractive index of the prepolymer 52.

The liquid crystal monomers 51 have birefringent optical characteristics. The ordinary refractive index of the liquid crystal monomers 51 is "no". The extraordinary refractive index of the liquid crystal monomers 51 is "ne". For an incident light, the ordinary refractive index makes a polarization direction of the incident light perpendicular to an optical axis of each of the liquid crystal monomers 51, and the extraordinary refractive index makes another polarization direction of the incident light parallel to the optical axis of each of the liquid crystal monomers 51.

Specifically, when the ordinary refractive index of the liquid crystal monomers 51 is the same as the refractive index of the prepolymer 52, in a front view direction, a refractive index of the liquid crystal monomers 51 is same as the refractive index of the prepolymer 52. In other words, the optical axis of each of the liquid crystal monomers 51 are aligned along a direction of the electric field and perpendicular to the first base substrate 2 and the second base substrate 4. Therefore, when the ordinary refractive index of the liquid crystal monomers 51 is the same as the refractive index of the prepolymer 52, the incident light, i.e. the excitation light, incident from a lower surface of the polymer dispersed liquid crystal layer 5 can directly pass through the polymer dispersed liquid crystal layer 5.

In this embodiment, a refractive index of the quantum dot color conversion layer 1 is greater than a refractive index of air. When an angle of light generated by excited quantum dots is greater than a critical angle, the light is confined in the quantum dot color conversion layer 1 and cannot be emitted due to total reflection, resulting in a decrease in light efficiency. Therefore, when the ordinary refractive index of the liquid crystal monomers 51 is the same as the refractive index of the prepolymer 52, and the extraordinary refractive index of the liquid crystal monomers 51 is different from the refractive index of the prepolymer 52, in a direction of a large viewing angle, the refractive index of the liquid crystal monomers 51 is different from the refractive index of the prepolymer 52. In the other words, when the ordinary refractive index of the liquid crystal monomers 51 is the same as the refractive index of the prepolymer 52, and the extraordinary refractive index of the liquid crystal monomers 51 is different from the refractive index of the prepolymer 52, the refractive index of the liquid crystal monomers 51 does not match the refractive index of the prepolymer 52. Therefore, the incident light, i.e. the excitation light, incident from a lower surface of the polymer dispersed liquid crystal layer 5 is scattered in different directions. A part of the excitation light having an angle greater than the critical angle and passing through the polymer dispersed liquid crystal layer 5 is scattered to other directions, so that it can be scattered into air to improve the overall brightness of the output light.

In this embodiment, the front view direction is a direction of a line of sight of a human eye that coincides with a normal line of a display screen. The direction of the large viewing angle is a direction of a line of sight of the human eye that is at an angle to the normal line of the display screen, and the angle is greater than 0° and less than 90°, or greater than 90° and less than 180°.

Figure 2:
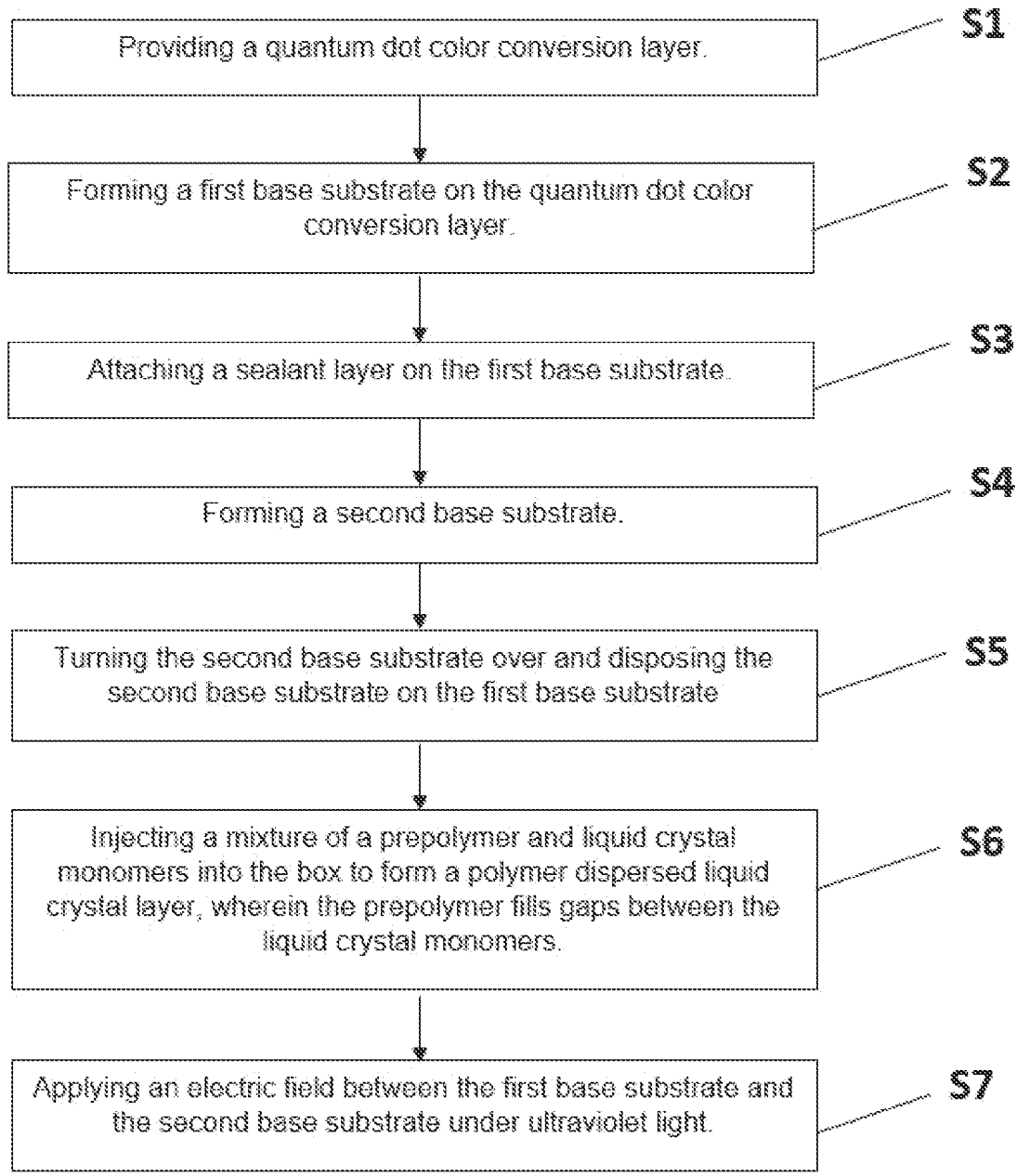
FIG. 2 is a flowchart of a method for fabricating the protective film according to an embodiment of the present disclosure.

Please refer to FIG. 2, the present disclosure further provides a method for fabricating a protective film. The method comprises steps S1 to S7.

S1: providing a quantum dot color conversion layer. The quantum dot color conversion laver realizes color conversion through quantum dots, thereby realizing RGB full-color display.

S2: forming a first base substrate on the quantum dot color conversion layer.

Figure 3:
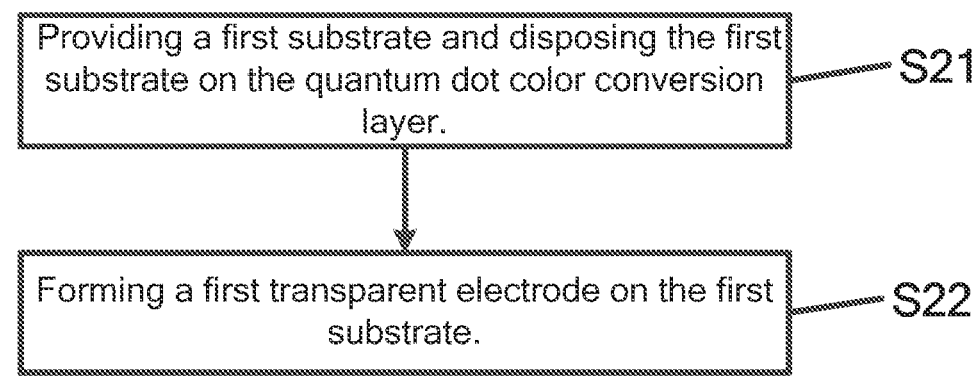
FIG. 3 is a flowchart of a method for fabricating a first base substrate according to an embodiment of the present disclosure.
Figure 4:
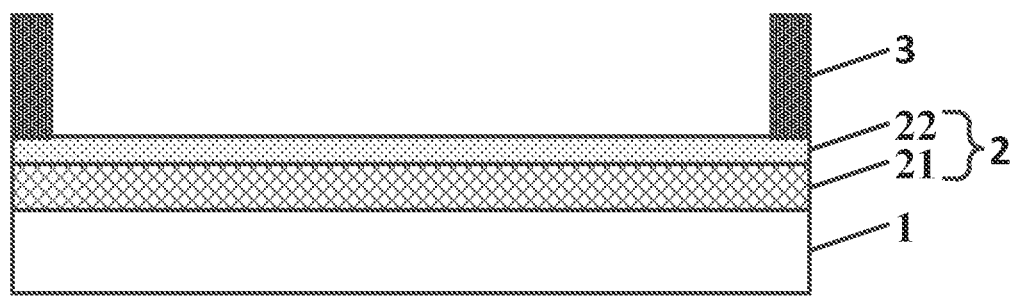
FIG. 4 is a schematic structural diagram of the first base substrate according to an embodiment of the present disclosure.

Please refer to FIG. 3 and FIG. 4, the step S2 of forming the first base substrate on the quantum dot color conversion layer specifically comprises steps S21 and S22.

S21: providing a first substrate 21 and disposing the first substrate 21 on the quantum dot color conversion layer 1.

S22: forming a first transparent electrode 22 on the first substrate 21. The first transparent electrode 22 is an indium tin oxide (ITO) electrode, a shown in FIG. 4.

S3: attaching a sealant layer on the first base substrate. An end-to-end adhesive strip is attached to an upper surface of the first base substrate 2 and close to a boundary of the first base substrate 2 to form a sealant layer 3, as shown in FIG. 4.

S4: forming a second base substrate.

Figure 5:
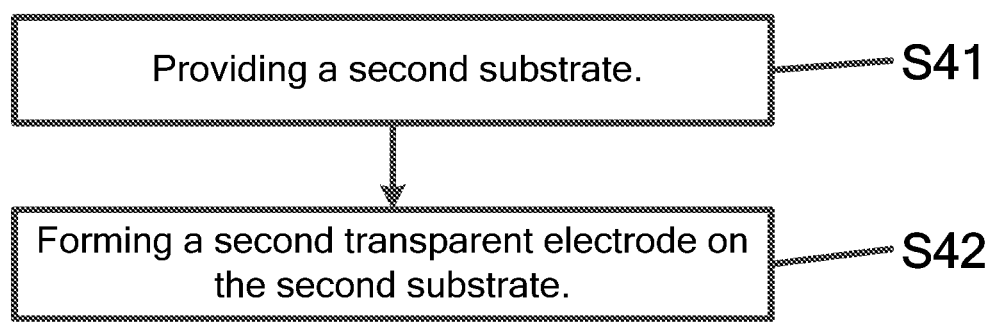
FIG. 5 is a flowchart of a method for fabricating a second base substrate according to an embodiment of the present disclosure.
Figure 6:
FIG. 6 is a schematic structural diagram of the second base substrate according to an embodiment of the present disclosure.

Please refer to FIG. 5 and FIG. 6, the step S4 of forming the second base substrate specifically comprises steps S41 and S42.

S41: providing a second substrate 41. S42: forming a second transparent electrode 42 on the second substrate 41. The second transparent electrode 42 is an ITO electrode.

S5: turning the second base substrate over and disposing the second base substrate on the first base substrate to form a box. A boundary of the second base substrate is attached to the boundary of the first base substrate through the sealant layer.

Figure 7:
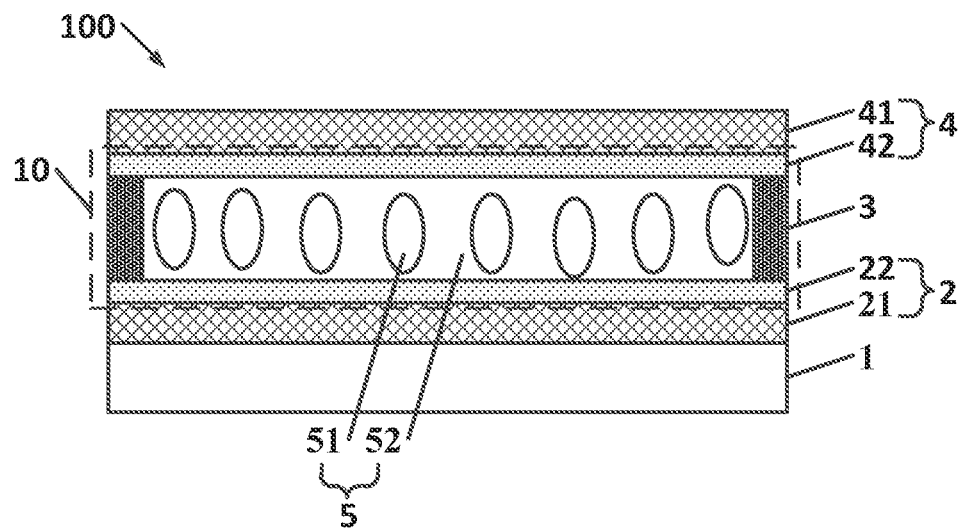
FIG. 7 is a schematic structural diagram of the protective film after a polymer dispersed liquid crystal layer is formed according to an embodiment of the present disclosure.

Please refer to FIG. 7, the second transparent electrode 42 is disposed opposite to the first transparent electrode 22. A boundary of the second transparent electrode 42 is attached to a boundary of the first transparent electrode 22 through the sealant layer 3 to form the box 10. A periphery of the box 10 is provided with an injection port and a gear line under the injection port.

S6: injecting a mixture of a prepolymer and liquid crystal monomers into the box to form a polymer dispersed liquid crystal layer, wherein the prepolymer fills gaps between the liquid crystal monomers. A refractive index of the liquid crystal monomers and a refractive index of the prepolymer are different.

In this embodiment, the mixture of the prepolymer and the liquid crystal monomers 51 may be injected into the box 10 by a one drop filling (ODF) process or a filling process. Preferably, an external device is configured to draw remaining air between the first transparent electrode 22 and the second transparent electrode 42 through gaps between the two transparent electrodes 22, 42 and the sealant layer 3, and draw air in a crystal filling machine to make an inside of the crystal filling machine high vacuum. Then, the injection port of the box 10 is in contact with a feed port of the crystal filling machine. The external device breaks the vacuum to atmospheric pressure. Then, using an atmospheric pressure difference and capillary principle, the mixture of the prepolymer and the liquid crystal monomers 51 is filled into the entire empty box 10 through the injection port among the two transparent electrodes 22, 42 and the sealant layer 3. The prepolymer 52 fills the gaps between the liquid crystal monomers 51 to form the polymer dispersed liquid crystal layer 5.

S7: applying an electric field between the first base substrate and the second base substrate under ultraviolet light.

Figure 8:
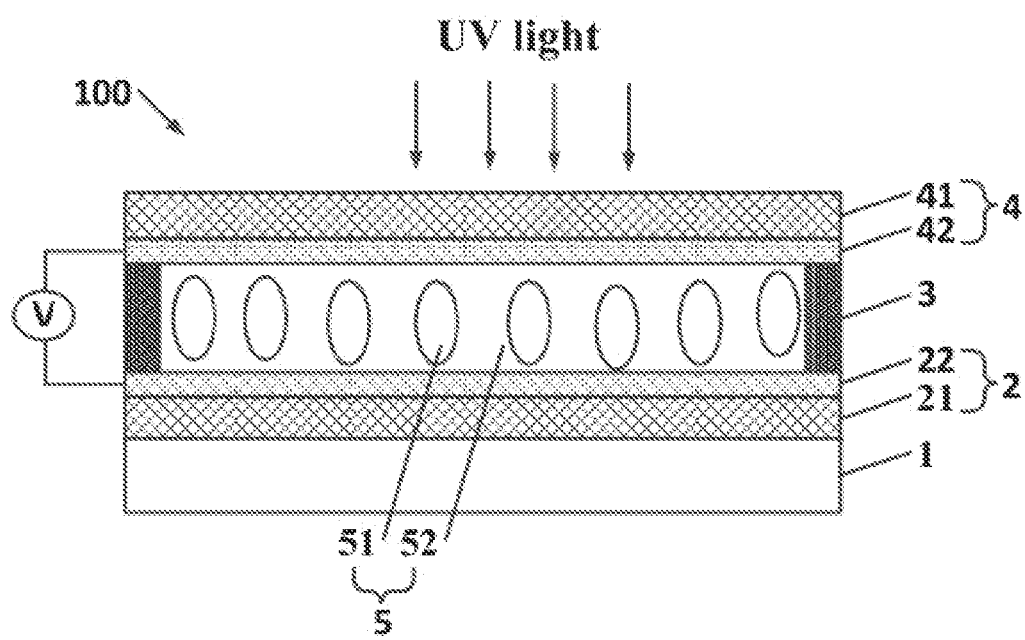
FIG. 8 is a schematic structural diagram of the protective film under ultraviolet light and an electric field according to an embodiment of the present disclosure.

Please refer to FIG. 8, under the ultraviolet light, the electric field is applied between the first transparent electrode 22 and the second transparent electrode 42. The first transparent electrode 22 and the second transparent electrode 42 are not limited to positive or negative, as long as an electric field can be applied between the first transparent electrode 22 and the second transparent electrode 42. When the polymer dispersed liquid crystal layer 5 is under the ultraviolet light and the electric field, the liquid crystal monomers 51 are aligned along a direction of the electric field and perpendicular to the first substrate 21 and the second substrate 42, and the prepolymer 52 is polymerized, thereby forming the protective film 100 with high light extraction efficiency. In other words, in absence of the ultraviolet light and the electric field, the liquid crystal monomers 51 are randomly arranged, and the prepolymer 52 will not be polymerized. The prepolymer 52 is preferably made of acrylic monomers, but is not limited thereto. In this embodiment, a weight percentage of the prepolymer is 20% to 70%, and a weight percentage of the liquid crystal monomers 51 is 30% to 80%. When an incident light passes through the protective film 100, it can have good light extraction efficiency. In other words, the incident light, i.e. an excitation light, passes through the quantum dot color conversion layer 1, the first base substrate 2, the polymer dispersed liquid crystal layer 5, and the second base substrate 4 in sequence. When the excitation light passes through the polymer dispersed liquid crystal layer 5, it is scattered in different directions. Therefore, when the protective film 100 is applied to a display panel, it can effectively improve overall brightness of output light, thereby improving user experiences. It should be noted that after removing the ultraviolet light and the electric field, in the protective film 100 fabricated by the above method in this embodiment, the liquid crystal monomers 51 are always in a vertical state, and the prepolymer 52 is always in a polymerized state. Therefore, when the protective film 100 is disposed on an upper surface of a display panel, light extraction efficiency of the display panel can be effectively ensured.

In this embodiment, an ordinary refractive index of the liquid crystal monomers 51 is same as a refractive index of the prepolymer 52, and an extraordinary refractive index of the liquid crystal monomers 51 is different from the refractive index of the prepolymer 52.

The liquid crystal monomers 51 have birefringent optical characteristics. The ordinary refractive index of the liquid crystal monomers 51 is "no". The extraordinary refractive index of the liquid crystal monomers 51 is "ne". For an incident light, the ordinary refractive index makes a polarization direction of the incident light perpendicular to an optical axis of each of the liquid crystal monomers 51, and the extraordinary refractive index makes another polarization direction of the incident light parallel to the optical axis of each of the liquid crystal monomers 51.

Specifically, when the ordinary refractive index of the liquid crystal monomers 51 is the same as the refractive index of the prepolymer 52, in a front view direction, a refractive index of the liquid crystal monomers 51 is same as the refractive index of the prepolymer 52. In other words, the optical axis of each of the liquid crystal monomers 51 are aligned along a direction of the electric field and perpendicular to the first base substrate 2 and the second base substrate 4. Therefore, when the ordinary refractive index of the liquid crystal monomers 51 is the same as the refractive index of the prepolymer 52, the incident light, i.e. the excitation light, incident from a lower surface of the polymer dispersed liquid crystal layer 5 can directly pass through the polymer dispersed liquid crystal layer 5.

In this embodiment, a refractive index of the quantum dot color conversion layer 1 is greater than a refractive index of air. When an angle of light generated by excited quantum dots is greater than a critical angle, the light is confined in the quantum dot color conversion layer 1 and cannot be emitted due to total reflection, resulting in a decrease in light efficiency. Therefore, when the ordinary refractive index of the liquid crystal monomers 51 is the same as the refractive index of the prepolymer 52, and the extraordinary refractive index of the liquid crystal monomers 51 is different from the refractive index of the prepolymer 52, in a direction of a large viewing angle, the refractive index of the liquid crystal monomers 51 is different from the refractive index of the prepolymer 52. In the other words, when the ordinary refractive index of the liquid crystal monomers 51 is the same as the refractive index of the prepolymer 52, and the extraordinary refractive index of the liquid crystal monomers 51 is different from the refractive index of the prepolymer 52, the refractive index of the liquid crystal monomers 51 does not match the refractive index of the prepolymer 52. Therefore, the incident light, i.e. the excitation light, incident from a lower surface of the polymer dispersed liquid crystal layer 5 is scattered in different directions. A part of the excitation light having an angle greater than the critical angle and passing through the polymer dispersed liquid crystal layer 5 is scattered to other directions, so that it can be scattered into air to improve the overall brightness of the output light.

Figure 9:
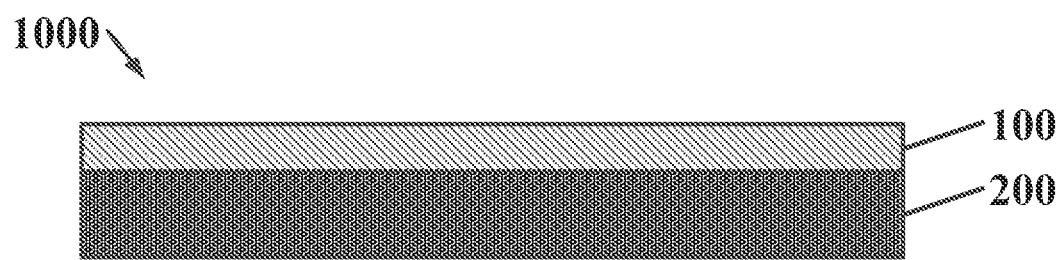
FIG. 9 is a schematic structural diagram of a display device according to an embodiment of the present disclosure.

Please refer to FIG. 9, the present disclosure further provides a display device 1000 comprising the protective film 100 fabricated by the above method and a display panel 200. The protective film 100 may be attached to an upper surface of the display panel 200 by an optical adhesive. The protective film 100 designed by a principle of light scattering is configured to improve luminous efficiency of the display panel 200. Specifically, in the display device 1000, scattering of the liquid crystal monomers 51 in the polymer dispersed liquid crystal layer 5 does not affect brightness of light in a front view direction, and can improve intensity of an emitted light, thereby effectively improving luminous efficiency of the display panel 200. Compared with current display devices, attaching the protective film 100 to the upper surface of the display panel 200 can increase the light extraction efficiency of the display panel 200 by 20-40%.

In the above embodiments, the description of each embodiment has its own emphasis. For parts not detailed in one embodiment, reference may be made to the related descriptions in other embodiments.

The protective film, the method for fabricating the same, and the display device provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A protective film, comprising:
   a quantum dot color conversion layer,
   a first base substrate disposed on the quantum dot color conversion layer,
   a polymer dispersed liquid crystal layer disposed on the first base substrate and comprising liquid crystal monomers and a prepolymer, wherein a refractive index of the liquid crystal monomers and a refractive index of the prepolymer are different; and
   a second base substrate disposed on the polymer dispersed liquid crystal layer.

2. The protective film according to claim 1, wherein each of the liquid crystal monomers has:
   an ordinary refractive index that makes a polarization direction of an incident light perpendicular to an optical axis of the liquid crystal monomer, and
   an extraordinary refractive index that makes another polarization direction of the incident light parallel to the optical axis of the liquid crystal monomer.

3. The protective film according to claim 1, wherein a weight percentage of the prepolymer is 20% to 70%, and a weight percentage of the liquid crystal monomers is 30% to 80%.

4. A method for fabricating a protective film, comprising:
   providing a quantum dot color conversion layer,
   forming a first base substrate on the quantum dot color conversion layer;
   attaching a sealant layer on the first base substrate;
   forming a second base substrate;

disposing the second base substrate on the first base substrate to form a box, wherein a boundary of the second base substrate is attached to a boundary of the first base substrate through the sealant layer, injecting a mixture of a prepolymer and liquid crystal monomers into the box to form a polymer dispersed liquid crystal layer, wherein the prepolymer fills gaps between the liquid crystal monomers, and a refractive index of the liquid crystal monomers and a refractive index of the prepolymer are different; and applying an electric field between the first base substrate and the second base substrate under ultraviolet light.

5. The method for fabricating the protective film according to claim 4, wherein in the step of applying the electric field between the first base substrate and the second base substrate under the ultraviolet light, the liquid crystal monomers are aligned along a direction of the electric field and perpendicular to the first base substrate and the second base substrate, the prepolymer is polymerized, an ordinary refractive index of the liquid crystal monomers is the same as the refractive index of the prepolymer, and an extraordinary refractive index of the liquid crystal monomers is different from the refractive index of the prepolymer.

6. A display device, comprising a display panel and a protective film disposed on the display panel, wherein the protective film comprises:

a quantum dot color conversion layer, a first base substrate disposed on the quantum dot color conversion layer, a polymer dispersed liquid crystal layer disposed on the first base substrate and comprising liquid crystal monomers and a prepolymer, wherein a refractive index of the liquid crystal monomers and a refractive index of the prepolymer are different; and a second base substrate disposed on the polymer dispersed liquid crystal layer.

* * * * *